United States Patent [19]

Kukanskis et al.

[11] Patent Number: 5,545,510

[45] Date of Patent: Aug. 13, 1996

[54] PHOTODEFINABLE DIELECTRIC COMPOSITION USEFUL IN THE MANUFACTURE OF PRINTED CIRCUITS

[75] Inventors: Peter Kukanskis, Woodbury; Peter Gabriele, Bristol; Raymond Letize, West Haven; William Adams, Woodbury, all of Conn.

[73] Assignee: Mac Dermid, Inc., Waterbury, Conn.

[21] Appl. No.: 412,286

[22] Filed: Mar. 28, 1995

[51] Int. Cl.[6] .............................. G03F 7/028; G03F 7/30
[52] U.S. Cl. .................. 430/312; 430/314; 430/280.1
[58] Field of Search ........................... 430/314, 280, 430/312, 280.1

[56] References Cited

U.S. PATENT DOCUMENTS

| | | | |
|---|---|---|---|
| 3,649,274 | 3/1972 | Older et al. | 430/312 |
| 3,982,045 | 9/1976 | Kukanskis et al. | 427/98 |
| 4,444,848 | 4/1984 | Shanefield et al. | 428/624 |
| 4,554,229 | 11/1985 | Small, Jr. | 430/280 X |
| 4,567,062 | 1/1986 | Fan | 430/312 X |
| 4,724,005 | 2/1988 | Minten et al. | 106/307 |
| 4,834,796 | 5/1989 | Kondo et al. | 106/1.23 |
| 4,847,114 | 7/1989 | Brasch et al. | 427/96 |
| 4,882,245 | 11/1989 | Gelorme et al. | 430/14 |
| 4,976,990 | 12/1990 | Bach et al. | 427/98 |
| 5,246,817 | 9/1993 | Shipley, Jr. | 430/312 |
| 5,262,280 | 11/1993 | Knudsen et al. | 430/280 X |
| 5,296,334 | 3/1994 | Castaldi et al. | 430/280 |
| 5,322,976 | 6/1994 | Knudsen et al. | 174/262 |
| 5,364,736 | 11/1994 | Eramo et al. | 430/280 |

FOREIGN PATENT DOCUMENTS

| | | | |
|---|---|---|---|
| 570094A2 | 11/1993 | European Pat. Off. | 430/312 |
| 2363321 | 6/1975 | Germany | 430/314 |

*Primary Examiner*—Cynthia Hamilton
*Attorney, Agent, or Firm*—John L. Cordani

[57] ABSTRACT

A composition and process useful in fabricating circuitry packages with permanent resists is proposed. The proposed composition comprises a carboxy functional resin, an acrylate oligomer, an epoxy functional resin, a butadiene nitrile resin, and a photoinitiator.

12 Claims, No Drawings

PHOTODEFINABLE DIELECTRIC COMPOSITION USEFUL IN THE MANUFACTURE OF PRINTED CIRCUITS

FIELD OF INVENTION

The present invention relates to a composition useful in the manufacture of printed circuits of various types. In particular, the composition of the present invention is useful in creating a photodefinable dielectric surface which is platable with acceptable adhesion. The composition is useful as a permanent photodefinable dielectric. As used herein "permanent resist" shall mean a permanent photodefinable dielectric.

BACKGROUND OF INVENTION

Printed circuit boards utilize a variety of resists in their manufacture. Typically the resists used are of a temporary or non-permanent type, meaning that the resist is used to create an image and then is later stripped from the surface. Various resists of this type are known and used in the art.

Printed circuit board designs using "permanent resists" are also known. A permanent resist is one which is used to create an image on a surface of the printed circuit board and then remains as an integral part of that surface (ie. is not stripped away). Permanent resists used in the manufacture of printed circuit boards are described in U.S. Pat. No. 3,982,045 issued Sept. 21, 1976 to Kukanskis, the teachings of which are incorporated herein by reference in their entirety. In addition see U.S. Pat. No. 4,882,245 issued to Gelorme et al, the teachings of which are incorporated herein by reference in their entirety. Also see U.S. Pat. Nos. 5,246,817 and 5,322,976, the teachings of which are incorporated herein by reference in their entirety. Shanefield et al., in U.S. Pat. No. 4,444,848, the teachings of which are incorporated herein by reference in their entirety, describes a modified epoxy material which plates with improved adhesion.

Attempts to manufacture useful permanent resists and printed circuit boards and packages using such resists have uncovered a number of difficulties. For a discussion of soldermasks and their compositions please refer to U.S. Pat. No. 5,296,334, the teaching of which are incorporated herein by reference in their entirety. Among the problems experienced are poor adhesion of the resist to the surface, particularly when temperature cycling is taken into consideration, inability to obtain suitable photodefinability of the resist, poor adhesion of subsequent metal platings to the surface of the resist, inability of the resist to withstand processing in the various subsequent processing chemicals, and/or inability of the resist to provide the appropriate dielectric properties necessary.

A permanent resist formulation and process which answered most or all of the above cited drawbacks would prove very beneficial in the fabrication of printed circuit boards, surface laminar circuitry packages and other important devices. Surface Laminar Circuitry ("SLC") is a technique whereby glass/epoxy laminate, or other substrates such as copper laminates, polyimides and polyetherimides, and a permanent resist are used to produce a structure resembling that of a semiconductor integrated circuit. This technology represents a change in the design concept of multilayer boards, and was developed to meet the requirements caused by the increasing rise of surface mounted devices for high resolution boards with high terminal pitch and enhanced wiring capability. It is an object of the current invention to provide such a permanent resist formulation and process.

SUMMARY OF THE INVENTION

It is, therefore, an object of the present invention to overcome disadvantages of the prior art. It is another object of the invention to provide a composition which is photodefinable into a permanent resist (i.e.permanent photodefineable dielectric) which has good adhesion properties both to the surface below it and to the metal subsequently plated onto it. It is yet a further object of the invention to provide a permanent photodefineable dielectric surface which is compatible with various plating solutions and therefore provides improved coverage and platability when plated upon. It is a further object of the current invention to present a composition which is useful as a permanent photodefineable dielectric on printed circuit boards, surface laminar circuitry packages, and other circuitry packages. Finally it is a still further object of the current invention to develop a permanent photodefineable dielectric which is capable of imagewise curing or partial curing in response to imagewise photo-radiation exposure and subsequent development in an aqueous medium. (e.g. alkali metal carbonate solution in water).

These and other objects are accomplished by the present invention which, in one aspect, is a photocurable composition comprising:

(a) at least one carboxy functional resin;

(b) at least one acrylate oligomer;

(c) at least one epoxy functional resin;

(d) at least one butadiene nitrile resin which may optionally be carboxy terminated;

(e) a photo-initiator which is optionally non-sulfur bearing; and (f) optionally filler.

As used in this specification and in the claims butadiene nitrile resin shall be interpreted as including, without limitation, copolymers of butadiene and acrylonitrile and butadiene-nitrile rubbers.

In another aspect, the present invention relates to the use of the above indicated composition as a permanent photodefineable dielectric in defining circuitry and vias in the following process:

(a) coating said composition onto a substrate;

(b) exposing the coating on the substrate to an imagewise pattern of radiation to which the composition is responsive in an amount sufficient to at least partially cure the composition;

(c) developing the exposed composition with a solution which will dissolve the non-exposed areas of the coating; and (d) optionally further curing the coating which remains on the substrate;

(e) optionally repeating steps (a)–(d);

(f) depositing a conductive material on at least those portions of the substrate which are not covered by the developed imagewise coating so as to form defined circuits and or interconnects on the surfaces, or depositing a conductive material onto the entire surface of the substrate and subsequently defining circuits and interconnects by etching away defined portions of the conductive material.

(g) Optionally repeated steps (a)–(e) so as to build several layers of circuitry.

DETAILED DESCRIPTION OF THE INVENTION

It has been discovered that when the composition of the present invention is used as a permanent photodefineable dielectric in circuit packages, such as printed circuit boards, various advantages are achievable over the prior art. Firstly, the permanent photodefineable dielectric formulation of the current invention provides good adhesion of the photodefineable dielectric to the surface to which it is applied. This adhesion is suitable such that delamination of the dielectric from the surface does not occur even after repeated temperature cyclings.

Secondly, the resist formulation of the current invention is photodefinable by imagewise exposure to photo-radiation and subsequent development in aqueous solution. Thus the current invention is soluble or developable in aqueous alkaline solutions, such as a solution of alkali metal carbonate and water. Heretofore, many-resist formulations, particularly permanent resist formulations, were developable only in objectionable solvents and solvent mixtures. Thus developability in an aqueous media provides definite advantages over solvent developability because of environmental, safety and cost concerns associated with the former solvents.

Thirdly, this permanent photodefineable dielectric formulation provides for excellent adhesion of plated metal to its surface. This characteristic of the present formulation is of particular importance. Thus in the past it has been difficult to obtain good metal to permanent resist adhesion while retaining other important dielectric and functional features. This invention, however, provides a permanent photodefineable dielectric that retains all the generally desired physical properties or resist features while providing excellent plated metal to dielectric adhesion. Adhesion of the plated metal to the permanent resist is typically in the range of 6-lbs/in. In addition these adhesion values are maintained even after temperature cycling such as solder shock for 10 seconds at 288° C. which is the standard test procedure in this industry. Coverage of the plated metal upon or near the permanent resist is also excellent. Although not wishing to be bound by theory, the inventors believe that the presence of the butadiene nitrile resin, particularly carboxy terminated and most preferably epoxy terminated, in the formulation provide for excellent plated metal to dielectric adhesion. In addition, the addition of fumed silica to the photodefineable permanent dielectric formulation also improves plated metal to dielectric adhesion. Other specific parameters of the formulation and the plating cycle also assist in increased adhesion of the plated metal to the surface.

Fourthly, this permanent photodefineable dielectric formulation is generally resistant to subsequent chemical processing. Thus the dielectric and all its properties remain in tact even after the necessary subsequent processing, chemical, thermal and mechanical.

Finally, this permanent photodefineable dielectric formulation provides excellent dielectric properties which allow it to act as the sole separator between circuit traces in the x, y and z planes. Thus dielectric constants of 3.30 to 3.50 are achievable with the permanent photodefineable dielectric formulation of the current invention. Thus this invention proposes the formulation of a permanent photodefineable dielectric with desireable properties such as hardness, dielectric properties, resist integrity through and after processing, resist to surface adhesion and plated metal to resist adhesion.

All of the above recited advantages and others are therefore achievable by utilizing a permanent resist formulation comprising:

(a) at least one carboxy functional resin;
(b) at least one acrylate oligomer;
(c) at least one epoxy functional resin;
(d) at least one butadiene nitrile resin which may optionally be carboxy terminated, preferably epoxy terminated;
(e) a photoinitiator which is optionally a non-sulfur bearing photoinitiator;
(f) optionally a filler, and
(g) at least one reactive monomer, which is preferrably an acrylate monomer.

The carboxy functional resin of the proposed resist formulation can be any one or several of various known types such as Morez 100 or 200 styrene acrylic carboxy functional copolymers—available from Morton International, Carboset 527, 526 or 1160—carboxy functional acrylic copolymers—available from B. F. Goodrich Company, or Scripset 550, or 560 available from Monsanto Company. The inventors have found Carboset 526 to be particularly useful in formulating the permanent photodefineable dielectric formulation of this invention. The concentration of the carboxy functional resin in the final permanent resist formulation can range from 2 to 50 weight percent, but is preferably at 5 to 25 weight percent and most preferably at 10 to 15 weight percent.

The acrylate oligomer used in the current invention can consist of any one or several of various known acrylate oligomers, such as CN961E75, CN972, CN120A75, CN120C80, Pro-1100, or Sarbox 350, 400 or 401—styrene maleic anhydrides ester of hydroxyethyl methacrylate—all available from the Sartomer Company. The inventors have found Pro-1100 to be particularly useful in formulating these proposed permanent photodefineable dielectric formulations. The concentration of the acrylate oligomer in the final formulation can range from 20 to 50 weight percent, but is preferably 25 to 40 weight percent and most preferably 30 to 40 weight percent.

The epoxy functional resin useful in these proposed permanent resist formulations may consist of any one or several epoxy resins such as the following:

ECN 1280 or 1299—Epoxy Cresol Novolac—available from Ciba-Geigy Corporation or Epulon N695, Epon 500×8 and Epon 872 available from Shell Corporation. The inventors have found ECN 1299 to be particularly useful in formulating the material proposed by this invention. The concentration of the epoxy resins useful herein in these formulations may range from 20 to 50 weight percent, but is preferably from 25 to 45 weight percent and most preferably from 30 to 40 weight percent.

Several butadiene nitrile resins (including a variety of copolymers of butadiene and acrylonitrile) are useful in the formulations of this invention, including:

Hycar 1300 X 8, 1300 X 13 or 1300 X 31 all available from B. F. Goodrich Company. The inventors have found Hycar 1300 X 8 to be a particularly useful carboxy terminated butadiene nitrile resin in the formulations of the current invention. The concentration of the butadiene nitrile resin in the final formulation should range from 1 to 10 weight percent, but is preferably from 2 to 6 weight percent and most preferably from 3 to 5 weight percent. It is preferable for the butadiene nitrile resin to be a carboxy terminated butadiene nitrile resin. In the most preferred embodiment of this invention, the carboxy terminated butadiene nitrile resin is an epoxy terminated butadiene nitrile resin. It is believed that epoxy terminated butadiene nitrile resins provide additional flexibility, improved dielectric properties, and enhanced durability to these resist formulations in comparison to resist formulations using other carboxy terminated butadiene nitrile resins.

Although many photoinitiators can usefully be applied in the formulation of this invention, the inventors have discovered that non-sulfur bearing photoinitiators provide advantages in the platability of the resist. Thus the current invention in its most preferred form, proposes a formulation which comprises only non-sulfur bearing constituents, particularly non-sulfur bearing photoinitiators. The non-sulfur bearing photoinitiators may take one or several known forms such as:

Benzoin ethers, alphahydroxy dialkylacetophenones, acyl phosphines, cyclic benzil deravitives, 3-Ketocoumerins, Quinones, Michler's Ketone, and Xanthone.

The inventors have found cyclic benzil derivatives to be a particularly suitable non-sulfur bearing photoinitiator as used in this invention. The concentration of the non-sulfur bearing photoinitiator in the resist formulation may range from 2 to 15 weight percent, but is preferably from 4 to 12 weight percent and most preferably from 8 to 10 weight percent. It is believed that non-sulfur bearing photoinitiators, particularly non-divalent sulfur bearing photoinitiators, provide advantages in the platability of the resin. The inventors discovered that sulfur bearing photoinitiators were incompatible with and interfered with the plating action of many plating baths when those baths were used to plate upon the surface of or near the surface of the permanent photodefineable dielectric which used such sulfur bearing photoinitiators. The permanent photodefineable dielectric formulation of the present invention answers these needs. Non-sulfur bearing as used herein shall mean a composition and/or photoinitiator which does not contain divalent or elemental sulfur.

Optionally, the formulations of the current invention may also contain filler materials such as silica. The inventors have discovered that the use of fumed silica, as opposed to other forms of silica such as amorphous silica, provides advantages. In particular the use of fumed silica as a filler in these compositions provides for improved adhesion of the plated metal to the surface of the resist as compared to compositions with amorphous silica. If used, the concentration of filler in these resist formulations may range from 0.5 to 5 weight percent, but is preferably from 1 to 2 weight percent and most preferably from 1 to 2 weight percent. As indicated above, the most preferred embodiment of this invention utilizes fumed silica as the filler material.

The reactive monomer of the current invention should be capable of undergoing cross-linking with the remainder of the formulation. Preferably the reactive monomer is a multifunctional acrylate or multifunctional methacrylate monomer. These may include one or several of various known compounds such as polyacrylates, polymethacrylates, 1,6-hexane diol diacrylate, acrylate esters of bisphenol-A based epoxies, tetraethylene glycol diacrylate and the like. The choice of any particular such compound or mixtures thereof will largely be dictated by reactivity for the (meth) acrylate groups on the esterified styrenemaleic anhydride copolymer, desired viscosity properties and the like.

In addition to the materials addressed above, other standard additives may also be included in the permanent resist composition of this invention. These additional additives include dyes, colors, flow modifiers, antifoams and other known additives.

In the most preferred embodiment, the formulation is separated into two parts which are mixed prior to use. Part A will contain all of the proposed components except for epoxy functional resin. Part B will contain those components missing from Part A. This procedure of separating the materials is recommended for extended shelf-life of the product.

As indicated this invention is particularly useful as a permanent photodefineable dielectric composition in fabricating printed circuit boards, surface laminar circuitry packages and other circuitry packages. As used in this manner the following process is proposed:

(a) coating said composition onto the surface of a substrate;

(b) exposing the coating to an imagewise pattern of radiation to which the composition is responsive in an amount sufficient to at least partially cure the composition;

(c) developing the exposed composition with a solution which will remove the non-exposed areas of the coating;

(d) optionally further curing the coating which remains on the substrate;

(e) optionally repeating steps (a)–(d);

(f) depositing a conductive material on at least those portions of the substrate which are not covered by the developed imagewise coating so as to form defined circuits and interconnects or depositing a conductive material onto the entire surface of the substrate and subsequently defining circuits and interconnects by etching away defined portions of that conductive material.

(g) Optionally repeating steps (a)–(f) so as to build several layers of circuitry.

As used herein interconnect shall mean an electrical connection between layers of circuitry.

In the proposed process, the permanent photodefineable dielectric composition may be coated onto the surface of the substrate in a variety of ways, including screening, roller coating, curtain coating, laminating, and spray coating, among others. The viscosity of the composition may be adjusted to suit the coating method and coating thickness desired.

After coating, the composition is photodefined by exposing the coated surface to an imagewise pattern of radiation. The radiation most useful in this manner is ultraviolet radiation, but other wavelengths of radiation may be used. Thus in the preferred embodiment of this invention the composition proposed, once coated, is subjected to imagewise ultraviolet radiation in an amount sufficient to partially cure the composition where it has been exposed.

The coated, exposed composition is then developed using a solution which selectively removes the non-exposed areas of the coating. One particular advantage of these proposed resist formulations is that they are developable in aqueous solution as opposed to environmentally unsafe, hazardous and objectionable solvents. Thus in the preferred embodiment of this invention, the coated, exposed composition is developed in an aqueous solution of sodium or potassium carbonate, such that only the unexposed areas are removed from the surface.

After development it is typical to further cure the resist composition which remains on the surface. As such, this additional curing is accomplished by additional exposure to heat and/or photo-radiation.

Finally the process proposes that a conductive material be deposited upon at least those portions of the substrate which are not covered with the resist. Thus it is proposed that plating can occur on only those areas where the resist has been removed (additive production of the circuits), on the entire surface including areas where the resist was removed by development as well as upon the resist itself (subtractive production of the circuits) or some degree of plating falling between these extremes (semi-additive production of the circuits). For a discussion of the specifics of circuitry and interconnect creation see U.S. Pat. No. 4,847,114 (Brasch et. al.), the teachings of which are incorporated herein by reference in their entirety.

If the additive process is chosen at this point, then plating will occur in those areas where the permanent photodefineable dielectric has been removed by development and upon the surface of the dielectric in a defined manner such that defined circuitry and interconnects are created. Thus, the plating itself will define the circuitry and other features desired. In the additive process the photodefinition of the permanent dielectric will create and define the circuitry and other surface features desired as well as the holes and vias which will interconnect the various layers of the circuitry package. If subtractive processing is chosen then the entire surface will be plated. The circuitry and other features will be defined by subsequent etching of the plated metal. In the subtractive manner, the photodefinition of the permanent resist will typically be used for the creation of holes and vias which connect the various layers of the circuitry package.

This brings out an additional advantage of the proposed composition and process. Because of its permanent nature, the resist of this invention is useful notably in defining not only circuitry and surface features of the circuitry package but also the holes and vias used to interconnect the layers of circuitry in the package. In addition, this permanent photodefineable dielectric is used to separate the circuitry in all three spacial directions. Because of its ability (due to dielectric and other properties) to separate and insulate the circuitry within a layer and from layer to layer, this permanent resist can be used to photo-define the holes of the circuitry package. Photolithography is preferred to mechanical drilling (the typical method of creating holes and vias) because smaller holes and vias can be created, and the holes and vias are formed and processed with greater ease and economy, in general, as compared to mechanical drilling. Holes and vias as small as 1.0 mil in diameter can be created.

Whichever type of processing is chosen (additive, substractive, or semi-additive), the surface plating can be accomplished in several ways. The most typical way is the use of known electroless plating techniques to plate either copper, nickel, or some other appropriate metal onto the desired surface. These techniques may include chemical roughening of the surface, conditioning, activation, acceleration and electroless plating. All of these steps are generally known and are described in U.S. Pat. Nos. 4,976,990 (Bach et. al.) and 4,834,796, the teachings both of which are incorporated herein by reference in their entirety.

Other methods of depositing metals onto the desired surfaces are known and may be utilized. These include direct metalization techniques such as those described in U.S. Pat. No. 4,724,005 (Minten et.al.), the teachings of which are incorporated herein by reference in their entirety. As an alternative, chemical vapor deposition may be utilized, in addition to a variety of other known methods for metal deposition upon non-conductive surfaces.

The composition and process of the proposed invention is further described by the following examples which are intended merely for additional description but are not limiting in any way.

EXAMPLE I

The following composition was prepared:

| | Percentage by Weight |
|---|---|
| Component A | |
| Partially esterified styrene maleic anhydride (Pro 1100, Sartomer Co.) | 34.4 |
| Carboxylated acrylic copolymer (Carboset XPD-1042, B. F. Goodrich Co.) | 23.8 |
| Multifunctional Acrylic monomer (SR 351, Sartomer Co.) | 2.5 |
| Butadiene Nitrile Resin (Hycar CTBN 1300, B. F. Goodrich Co.). | 4.8 |
| Photoinitiator (Acetophenone) | 12.4 |
| Aerosil R 974 (fumed Silica, Degussa, Co.) | 2.3 |
| Epoxy Novolac Acrylate (CN 112C60, Sartomer Co.) | 16.3 |
| Inert Divent | 3.5 |
| Component B | |
| Multifunctional Epoxy Resin (ECN-1299, Ciba Geigy Co.) | 47 |
| Epoxy Novolac Acrylate | 51 |
| Filler | 2 |

1. Application of Resist

After preparation, the composition was mixed in proper proportion and coated onto the surface of a cleaned and prepared copper coated epoxy/glass laminate by means of Curtain Coating. The coating thickness was 1 mil (wet). The coated copper surface was then dried and imagewise exposed to ultraviolet radiation in an amount of 200 watts per $cm^2$. The exposed surface was then developed by spraying a solution of 10 gr/l potassium carbonate at 100° F. onto the surface, thereby selectively removing the unexposed portions of the resist. Finally the remaining resist was further cured by baking at 300° for 1 hour.

2. Plating

The surface was then plated using the following process:

| Process Step | Time (min) | Temperature (°F.) |
|---|---|---|
| Solvent Swellant | 3 | 110 |
| Permanganate Etch | 5 | 165 |
| Permanganate Reducer | 4 | 120 |
| Condition | 5 | 120 |
| Copper Microetch | 2 | 90 |
| Activate | 5 | 90 |
| Accellerate | 2 | 120 |
| Electroless Metal Deposition | 15 | 95 |
| Electrolytic Copper Flash | 5 | 80 |
| Photo-Resist Application | | |
| Pattern Plate Copper | | |
| Pattern Plate Tin | | |
| Strip the Photo-Resist | | |
| Etch exposed Copper | | |
| Strip Tin resist. | | |

Note: Fresh water rinses were interposed between chemical process steps and at the end of processing.

The adhesion of the plated metal to the permanent photodefinable dielectric surface was excellent. No blistering or peeling was observed. The adhesion of the metal to the surface was measured to be 4.8 lbs/in. In addition, the coverage of the surface with the plated metal was excellent. Substantially no voids in coverage were observed.

EXAMPLE II

Example I was repeated except that the butadiene nitrile resin was not included in the composition. The composition of component A was therefore the following:

| Component A | Percentage by Weight |
|---|---|
| Partially esterified styrene maleic anhydride (Pro 1100, Saromer Co.) | 34.4 |
| Carboxylated acrylic copolymer (Carboset XPD-1042, B. F. Goodrich) | 23.8 |
| Multifunctional Aerylic Monomer (SR351, Sartomer Co.) | 7.3 |
| Photoinitiator (acetophenone) | 12.4 |
| Aerosil R 974 (Degussa) | 2.3 |
| Epoxy Novolac Acrylate (CN112C60, Sartomer Co.) | 16.3 |
| Inert Diluent | 3.5 |

The results yielded poor adhesion of the plated metal to the permanent photodefinable dielectric surface. Significant blistering and peeling of the metal from the surface was observed. The adhesion of the metal to the surface was measured to be 0.5 lb/in. Because of the blistering and peeling, coverage could not be evaluated accurately.

EXAMPLE III

Example I was repeated except that the photoinitiator was replaced with a sulfur bearing photoinitiator (Irgacure 907, Ciba Geigy Co.) at the same concentration.

The results yielded poor coverage of the permanent photodefineable dielectric surface with the plated metal. Significant voids in the plating were observed. In addition a black smut was observed in the voids and on the metal surfaces. Because of the significant voiding, adhesion could not be evaluated accurately.

EXAMPLE IV

Example I was repeated except that the fumed silica (Aerosil R 974, Degussa Co.) was replaced with amorphous silica at the same concentration.

The results yielded moderate adhesion. No significant blistering or peeling was observed. The adhesion of the metal to the surface was determined to be 3.0 lbs/in. In addition the coverage of the surface with the plated metal was excellent. Substantially no voids in coverage were observed.

What is claimed is:

1. A process for fabricating a circuitry package comprising:
   (a) Coating the surface of a substrate with a composition comprising;
      (1) at least one carboxy functional resin;
      (2) at least one acrylate oligomer;
      (3) at least one epoxy functional resin;
      (4) at least one elastomer selected from the group consisting of copolymers of butadiene with acrylonitrile, carboxy terminated copolymers of butadiene with acrylonitrile and epoxy terminated copolymers of butadiene with acrylonitrile;
      (5) at least one photoinitiator; and
      (6) at least one reactive monomer;
   (b) exposing the coating to an imagewise pattern of radiation, to which the composition is responsive, in an amount sufficient to at least partially cure the exposed areas of the composition;
   (c) developing the exposed composition with a solution which will selectively remove the non-exposed areas of the coating.
   (d) optionally, further curing the coating which remains on the surface;
   (e) optionally repeating Steps (a)-(d);
   (f) depositing a conductive material onto the entire surface;
   (g) subsequently defining circuitry and interconnects by etching away defined portions of the conductive material;
   (h) optionally, repeating steps (a) through (g) so as to build more than one layer of circuitry.

2. A process according to claim 1 wherein the photoinitiator is a non-sulfur bearing photoinitiator.

3. A process according to claim 2 wherein the elastomer is an epoxy terminated copolymer of butadiene with acrylonitrile.

4. A process according to claim 1 wherein the elastomer is an epoxy terminated copolymer of butadiene with acrylonitrile.

5. A process according to claim 1 wherein the composition also comprises a filler.

6. A process according to claim 5 wherein the filler is fumed silica.

7. A process according to claim 1 wherein the composition comprises:
   (a) from 2 to 50 weight percent of a carboxy functional resin;
   (b) from 23 to 50 weight percent of an acrylate oligomer;
   (c) from 20 to 50 weight percent of an epoxy functional resin;
   (d) from 1 to 10 weight percent of of an elastomer selected from the group consisting of copolymers of butadiene with acrylonitrile, carboxy terminated copolymers of butadiene with acrylonitrile, and epoxy terminated copolymers of butadiene with acrylonitrile.

8. A process according to claim 7 wherein the photoinitiator is a non-sulfur bearing photoinitiator.

9. A process according to claim 7 wherein the elastomer is an epoxy terminated copolymer of butadiene with acrylonitrile.

10. A process according to claim 7 wherein the composition also comprises a filler.

11. A process according to claim 10 wherein the filler is fumed silica.

12. A process according to claim 7 wherein the reactive monomer is selected from the group consisting of multifunctional acrylates and multifunctional methacrylates.

* * * * *